US012575110B2

(12) United States Patent
Gong et al.

(10) Patent No.: US 12,575,110 B2
(45) Date of Patent: Mar. 10, 2026

(54) LOCALIZED ANNEAL OF FERROELECTRIC DIELECTRIC

(71) Applicant: INTERNATIONAL BUSINESS MACHINES CORPORATION, Armonk, NY (US)

(72) Inventors: Nanbo Gong, White Plains, NY (US); Takashi Ando, Eastchester, NY (US); Guy M. Cohen, Westchester, NY (US); Hiroyuki Miyazoe, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 741 days.

(21) Appl. No.: 17/822,215

(22) Filed: Aug. 25, 2022

(65) Prior Publication Data

US 2024/0074207 A1 Feb. 29, 2024

(51) Int. Cl.
*H01L 27/11507* (2017.01)
*H10B 53/30* (2023.01)

(52) U.S. Cl.
CPC .................................... *H10B 53/30* (2023.02)

(58) Field of Classification Search
CPC ................................. H10B 53/30; H10D 1/682
See application file for complete search history.

(56) References Cited

U.S. PATENT DOCUMENTS

| 7,173,842 B2 | 2/2007 | Isenberger |
| 7,675,066 B1 | 3/2010 | Dougherty |
| 8,344,475 B2 | 1/2013 | Shaeffer |
| (Continued) | | |

FOREIGN PATENT DOCUMENTS

| CN | 119769189 A | 4/2025 |
| JP | 2006269611 A | 10/2006 |
| (Continued) | | |

OTHER PUBLICATIONS

Burr, et al., "Recent Progress in Phase-Change Memory Technology." Published Jun. 2016. 17 pages. In IEEE Journal on Emerging and Selected Topics in Circuits and Systems, vol. 6, No. 2, pp. 146-162, doi: 10.1109/JETCAS.2016.2547718.

(Continued)

*Primary Examiner* — Ermias T Woldegeorgis
(74) *Attorney, Agent, or Firm* — Seed Intellectual Property Law Group LLP

(57) ABSTRACT

A semiconductor device includes a ferroelectric random-access memory (FeRAM) cell. The FeRAM includes a ferroelectric dielectric that is annealed to attain its ferroelectric phase by an induced current flow and heating process. The current flow may be induced though a temporary wire that causes heating of the FeRAM cell. The resulting heating or anneal of the ferroelectric dielectric may crystalize the ferroelectric dielectric to embody or result in having ferroelectric properties. The induced current flow and heating process is substantially local to the FeRAM cell, and to ferroelectric dielectric therein, as opposed to a global heating or annealing process in which the entire semiconductor device, or a relatively larger region of semiconductor device, is heated to the requisite annealing temperature of ferroelectric dielectric.

22 Claims, 16 Drawing Sheets

(56)　　　　　References Cited

U.S. PATENT DOCUMENTS

| | | | |
|---|---|---|---|
| 10,680,071 | B2 | 6/2020 | Yamaguchi |
| 10,872,905 | B2 | 12/2020 | Müller |
| 11,201,007 | B2 | 12/2021 | De Rochemont |
| 2004/0113137 | A1 | 6/2004 | Lowrey |
| 2006/0019033 | A1 | 1/2006 | Muthukrishnan |
| 2007/0045689 | A1* | 3/2007 | Lim ....................... H10B 53/30 |
| | | | 257/295 |
| 2010/0025811 | A1 | 2/2010 | Bronner |
| 2014/0063913 | A1 | 3/2014 | Kawashima |
| 2019/0057860 | A1 | 2/2019 | Yoon |
| 2020/0411755 | A1 | 12/2020 | Lin |
| 2021/0057455 | A1 | 2/2021 | Nishida |

FOREIGN PATENT DOCUMENTS

| | | | |
|---|---|---|---|
| WO | 20040055880 | A1 | 7/2004 |
| WO | 2024/041048 | A1 | 2/2024 |

OTHER PUBLICATIONS

Muller, et al., "Ferroelectric Hafnium Oxide Based Materials and Devices: Assessment of Current Status and Future Prospects." Published Feb. 21, 2015. 7 pages. ECS Journal of Solid State Science and Technology, vol. 4, No. 5, pp. N30-N35. https://iopscience.iop.org/article/10.1149/2.0081505jss.

International Search Report and Written Opinion dated Jun. 23, 2023, for International Application No. PCT/CN2023/094822, filed May 17, 2023.

* cited by examiner

200

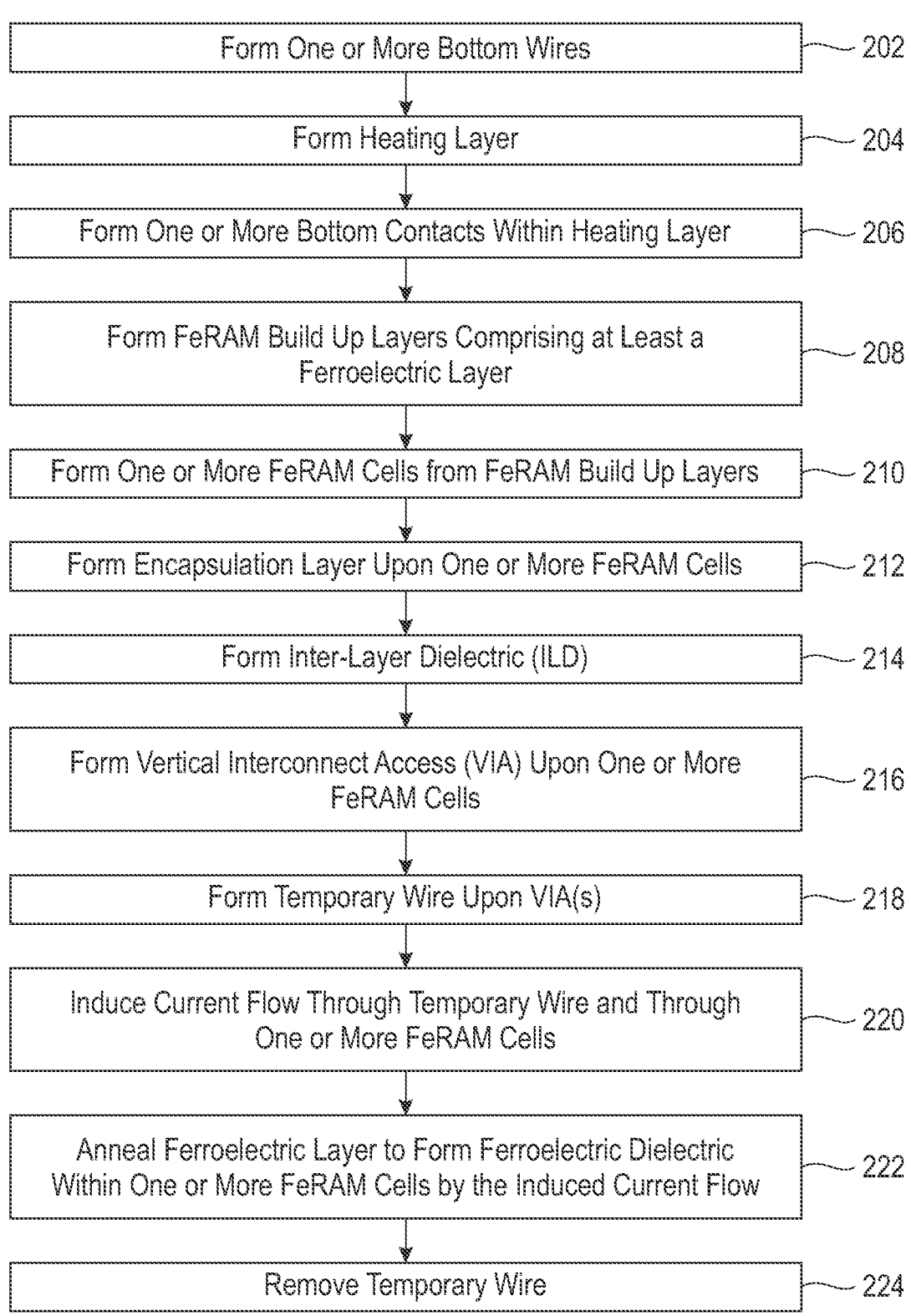

Form One or More Bottom Wires — 202

Form Heating Layer — 204

Form One or More Bottom Contacts Within Heating Layer — 206

Form FeRAM Build Up Layers Comprising at Least a Ferroelectric Layer — 208

Form One or More FeRAM Cells from FeRAM Build Up Layers — 210

Form Encapsulation Layer Upon One or More FeRAM Cells — 212

Form Inter-Layer Dielectric (ILD) — 214

Form Vertical Interconnect Access (VIA) Upon One or More FeRAM Cells — 216

Form Temporary Wire Upon VIA(s) — 218

Induce Current Flow Through Temporary Wire and Through One or More FeRAM Cells — 220

Anneal Ferroelectric Layer to Form Ferroelectric Dielectric Within One or More FeRAM Cells by the Induced Current Flow — 222

Remove Temporary Wire — 224

FIG. 16

LOCALIZED ANNEAL OF FERROELECTRIC DIELECTRIC

BACKGROUND

The present disclosure relates generally to the field of semiconductor device technology and more particularly to locally annealing a ferroelectric dielectric within a ferro-electric random-access memory (FeRAM).

Embodiments of the present disclosure recognize that FeRAM is a non-volatile solid-state memory technology that exploits the presence or lack of an electrical charge in a capacitor that includes a ferroelectric dielectric between electrodes. The fundamental storage unit (the "cell") can be programmed into at least two different states, or levels, which exhibit different charge characteristics. The program-mable cell-states can be used to represent different data values, permitting storage of information.

Embodiments of the present disclosure relate to FeRAM cells and their associated wiring and signaling transistors. Each cell typically operates in association with one signaling transistor. Data may be stored as the presence or lack of an electrical charge in the ferroelectric dielectric, with the lack of charge in general representing "0" and the presence of an electrical charge representing "1." Writing is accomplished by applying a field across the ferroelectric dielectric by charging the electrodes on either side of it, forcing the atoms inside into the "up" or "down" orientation (depending on the polarity of the charge), thereby storing a "1" or "0". Reading the cell may be accomplished by the signaling transistor forcing the cell into a particular state, say "0". If the cell held a "0", no change happens in the output lines. If the cell held a "1", the re-orientation of the atoms in the film will cause a brief pulse of current in the output as they push electrons out of the metal on the "down" side. The presence of this pulse means the cell held a "1". Since this process over-writes the cell, reading FeRAM is a destructive process, and requires the cell to be re-written.

Embodiments of the present disclosure recognize that ferroelectrics, such as Hafnium Oxide ($HfO_2$), are promising materials for electronic synapse devices, memristor devices for neuromorphic computing, as well as non-volatile memory devices. To integrate a ferroelectric dielectric in a FeRAM cell, a high (e.g., greater than 400° C.) anneal temperature may be necessary to attain its ferroelectric phase in which the ferroelectric dielectric embodies or has ferroelectric properties such that spontaneous electric polar-ization can be reversed by the application of an external electric field. Subjecting the entire wafer, device, or the like to such high temperatures may damage, melt, or the like, other features or materials associated therewith. Therefore, as opposed to such global heating of the entire wafer, semiconductor device, or the like, embodiments of the present disclosure are directed to localized annealing of the ferroelectric dielectric where adequate heat is applied to the ferroelectric dielectric, without globally heating the entire wafer, device, etc. Since the entire wafer, device, etc., is not subjected to temperatures required to adequately anneal the ferroelectric dielectric, damage to other features, compo-nents, or materials associated therewith may be limited or reduced.

SUMMARY

In an embodiment of the present disclosure, a semicon-ductor device fabrication method is presented. The method includes forming a ferroelectric random-access memory (FeRAM) cell that includes a ferroelectric dielectric between a top electrode and a bottom electrode. The method further includes forming a cell vertical interconnect access (VIA) upon the FeRAM cell. The method further includes forming a temporary wire upon the cell VIA. The method further includes annealing the ferroelectric dielectric to attain a ferroelectric phase by inducing current flow though the temporary wire. The ferroelectric dielectric may be a Haf-nium Oxide ferroelectric dielectric.

In an embodiment of the present disclosure, another semiconductor device fabrication method is presented. The method includes forming a bottom wire over a substrate. The method further includes forming a bottom heater contact upon the bottom wire. The method further includes forming a ferroelectric random-access memory (FeRAM) cell upon the bottom heater contact. The FeRAM cell includes a ferroelectric dielectric between a top electrode and a bottom electrode. The method further includes forming a cell ver-tical interconnect access (VIA) upon the FeRAM cell. The method further includes forming a temporary wire upon the cell VIA. The method further includes annealing the ferro-electric dielectric to attain a ferroelectric phase by inducing current flow though the temporary wire.

The methods may further include removing the temporary wire after annealing the ferroelectric dielectric. Removing the temporary wire may include mechanically grinding away the temporary wire and retaining at least a portion of the cell VIA there below.

In an embodiment of the present disclosure, a semicon-ductor device is presented. The semiconductor device includes a bottom heater contact. The semiconductor device a ferroelectric random-access memory (FeRAM) cell upon the bottom heater contact. The FeRAM cell includes a Hafnium Oxide ferroelectric dielectric between a top elec-trode and a bottom electrode. The semiconductor device further includes a cell vertical interconnect access (VIA) upon the FeRAM cell.

The embodiments of the disclosure generally allow or provide for the integration of a ferroelectric dielectric in a FeRAM cell which typically requires a ferroelectric dielec-tric anneal temperature to attain its ferroelectric phase. Subjecting the entire wafer, device, or the like to such high temperatures may damage, melt, or the like, other features or materials associated therewith. Therefore, embodiments of the present disclosure are directed to localized annealing of the ferroelectric dielectric where adequate heat is applied to the ferroelectric dielectric by inducing current flow through the FeRAM cell, without globally heating the entire wafer, device, etc. Since the entire wafer, device, etc., is not subjected to temperatures required to adequately anneal the ferroelectric dielectric, damage to other features, compo-nents, or materials associated therewith may be limited or reduced.

The above and other aspects, features, and advantages of various embodiments of the present disclosure will be more apparent from the following description taken in conjunction with the accompanying drawings.

BRIEF DESCRIPTION OF THE DRAWINGS

The above and other aspects, features, and advantages of various embodiments of the present disclosure will be more apparent from the following description taken in conjunction with the accompanying drawings.

FIG. 16 depicts a method of fabricating a semiconductor device that comprises a FeRAM cell with a locally annealed ferroelectric dielectric, in accordance with embodiments of the present disclosure

DETAILED DESCRIPTION

Figure 1:
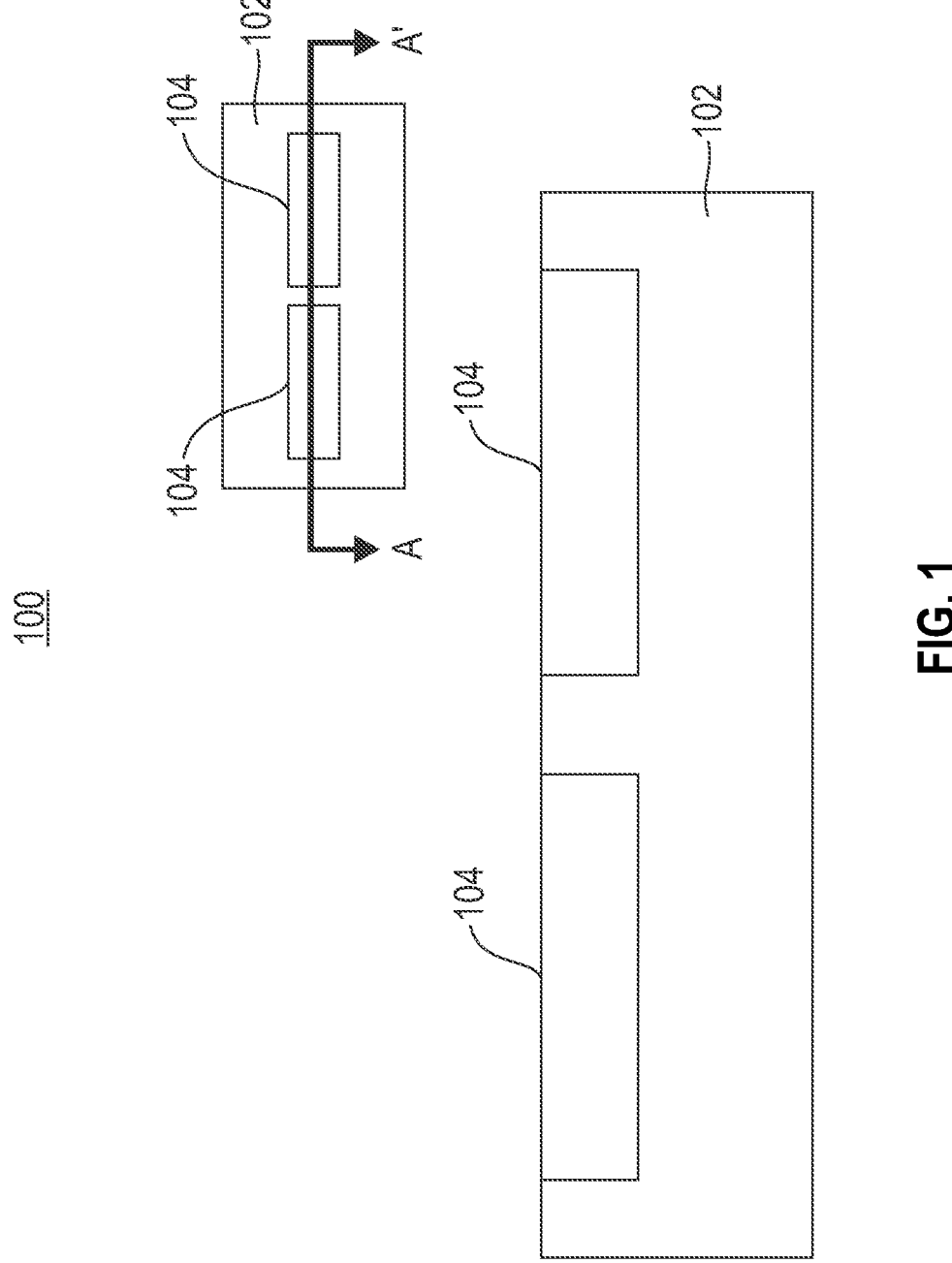
FIG. 1 though FIG. 15 are cross-sectional fabrication views that depict a method of fabricating a semiconductor device that comprises a FeRAM cell with a locally annealed ferroelectric dielectric, in accordance with embodiments of the present disclosure.

It is understood in advance that although a detailed description is provided herein of an exemplary FeRAM architecture that includes ferroelectric dielectric that is locally annealed, implementation of the teachings recited herein are not limited to the FeRAM architecture described herein. Rather, embodiments of the present disclosure are capable of being implemented in conjunction with any other appropriate type of memory, semiconductor, or integrated circuit (IC) device now known or later developed.

Various embodiments of the present disclosure are described herein with reference to the related drawings. Alternative embodiments can be devised without departing from the scope of this disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. Various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, deposition, removal/etching, semiconductor doping and patterning/lithography. Deposition, depositing, or the like, is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photolithography resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

FIG. 1 through FIG. 15 depict cross-sectional views of fabrication stages of a fabrication method of forming a semiconductor device 100 that includes one or more FeRAM cells, in accordance with various embodiments of the present disclosure. In the exemplary fabrication stages depicted, the FeRAM cell includes a ferroelectric dielectric that is locally annealed.

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched, and the second element can act as an etch stop.

The terms "about," "substantially," "approximately," and variations thereof, are intended to include the degree of error associated with measurement of the quantity based upon the equipment available at the time of filing the application. For example, substantial coplanarity between various materials can include an appropriate manufacturing tolerance of ±8%, ±5%, or ±2% difference between the coplanar materials.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. Various steps in the manufacture of semiconductor devices and semiconductor-based ICs are well known and so, in the interest of brevity, many conventional steps will only be mentioned briefly herein or will be omitted entirely without providing the well-known process details.

Films of both conductors (e.g., polysilicon, aluminum, copper, etc.) and insulators (e.g., various forms of silicon dioxide, silicon nitride, etc.) may be used to connect components. Selective doping of various regions of the semiconductor device allows the conductivity of the semiconductor device to be changed with the application of voltage. By creating structures of these various components, millions of semiconductor microdevices, such as FeRAM cells, can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photolithography resist. To build the complex structures that make up a microdevice and the many wires that connect the millions of transistors of a circuit, lithography and etch pattern transfer steps are repeated multiple times. Each pattern being printed on the semiconductor device layers are aligned to the previously formed patterns and slowly the conductors, insulators and selectively doped regions are built up to form the final semiconductor device, IC package, or the like.

FIG. 1 depicts a cross-sectional view of a fabrication stage of forming semiconductor device 100, in accordance with various embodiments of the present disclosure. After the present fabrication stage, semiconductor device 100 includes substrate 102 and one or more bottom wires 104.

Substrate 102 is generally formed from a semiconductor or dielectric material. In a preferred implementation, substrate 102 may be formed from a low-k dielectric material (i.e., a material with a smaller dielectric relative to silicon dioxide, such as SiCOH). In some implementations, substrate 102 may be an inter-layer dielectric (ILD) layer whereby additional layer(s) of the semiconductor device 100 have previously been fabricated there below. In these implementations, electrical microdevices, such as transistors, diodes, capacitors, resistors, or the like, may be formed within the additional layer(s) of the semiconductor device 100 by any suitable formation method.

The substrate 102 and/or the additional layer(s) of the semiconductor device 100 may include semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some implementations, bottom wires 104 may be a part of or below a metallization layer of the semiconductor device 100. A metallization layer may be denoted as Mx, where x=0, 1, 2, . . . , where M0 refers to the lowest (e.g., closest to the substrate 102) metallization layer, and the index x increases by 1 for each additional metallization layer. In some implementations, electrically conductive features, such as conductive lines, contacts, and/or vias, provide electrical connection from bottom wires 104 to features above and/or below bottom wires 104, such as the microdevices there below or wiring features there above. In some implementations, bottom wires 104 may also be referred to as pads, plugs, planes, traces, or the like, respectively.

In some implementations, bottom wires 104 include an internal conductive region and a conductive barrier layer(s) (not shown) lining sidewalls and bottom surfaces of the internal conductive region. The conductive barrier layer(s) may be formed of titanium, titanium nitride, tantalum, tantalum nitride, cobalt, a combination thereof, or the like. The internal conductive region may be formed of metals such as copper, aluminum, tungsten, cobalt, alloys thereof, or the like. For example, one or more electrical pathways may connect bottom wire 104 with a FeRAM memory controller to sense a resistance across an associated FeRAM cell, or the like.

The formation of bottom wires 104 may include etching portions of the substrate 102 to form openings, forming a blanket conductive barrier layer extending into the openings, depositing metal over the blanket conductive barrier layer, and performing a planarization process, such as a CMP process or a mechanical grinding process, to remove excess portions of the blanket conductive barrier layer and excess portions internal conductive region so that the top surface of the substrate 102 and the bottom wires 104 are coplanar.

Figure 2:
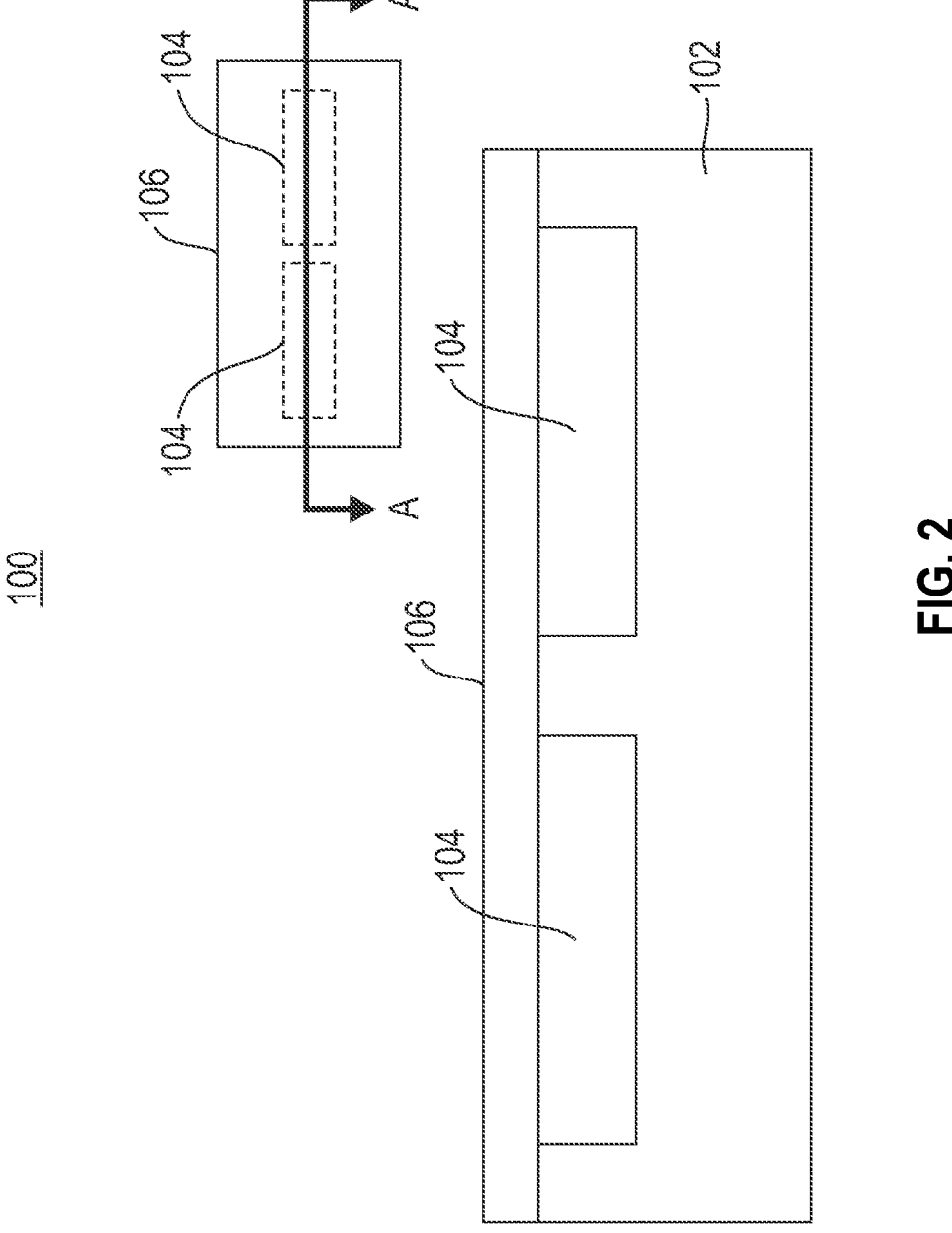

FIG. 2 depicts a cross-sectional view of a fabrication stage of forming semiconductor device 100, in accordance with various embodiments of the present disclosure. At the present fabrication stage, a heater layer 106 is formed upon the substrate 102 and upon the one or more bottom wires 104.

Heater layer 106 may be, for example, a Silicon layer or Silicon-based layer such as Silicon Nitride layer. Heater layer 106 may be formed by depositing a blanket dielectric layer to a thickness between 1 and 100 nm. In a preferred implementation, heater layer 106 may be formed to a thickness between 5 and 20 nm. Heater layer 106 may be a dielectric layer in which a bottom heater, bottom contact, or the like, of the FeRAM cell is formed.

Figure 3:
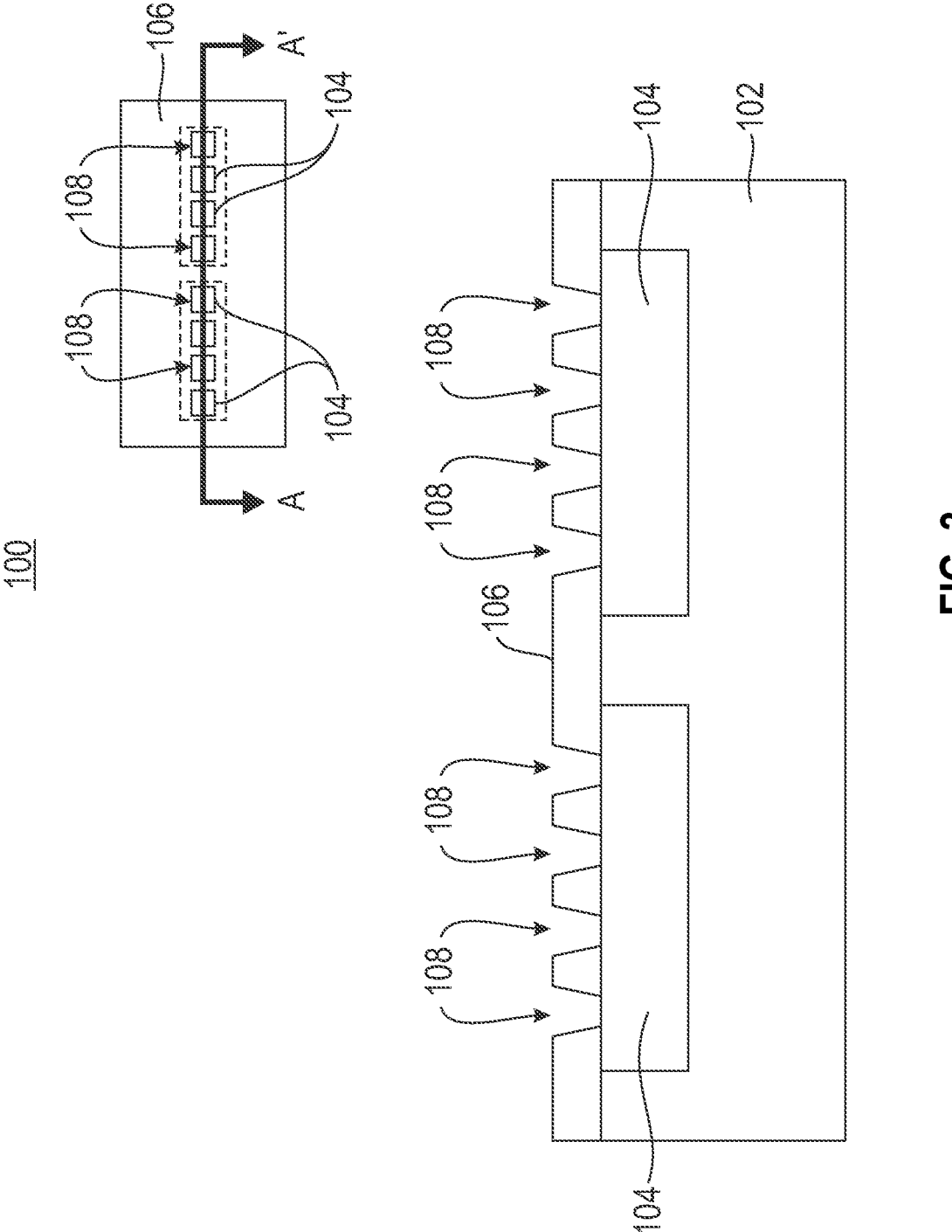

FIG. 3 depicts a cross-sectional view of a fabrication stage of forming semiconductor device 100, in accordance with various embodiments of the present disclosure. At the present fabrication stage, heater layer 106 is patterned by forming one or more bottom contact trenches 108 therein.

Bottom contact trench 108 may be formed by photolithography techniques. For example, a photolithography resist (not shown) may be formed upon heater layer 106. The photolithography resist may be applied as a liquid upon heater layer 106 that may dry and be patterned generally forming trenches within the photolithography resist. The photolithography resist may also be a semi-solid film coated, laminated, or otherwise formed upon heater layer 106. For example, the photolithography resist may have a thickness ranging from about 10 um to about 500 um, although a thickness less than 40 um and greater than 500 um have been contemplated. In one implementation, the photolithography resist may be about 150 um to 175 um thick.

A pattern may be formed in the photolithography resist by removing portions of the photolithography resist. For example, portions of the photolithography resist may be exposed to radiation, such as deep ultraviolet light, or electron beams. Once the patterning of the photolithography resist is completed, portions of the photolithography resist may be retained and portions of the photolithography resist may be etched away by an etchant that removes the photolithography resist. The portions of the photolithography resist that are retained may form patterned photolithography resist. The portions of photolithography resist that are etched away form resist trenches that may reveal the underlying heater layer 106. Using the patterned photolithography resist as a mask whereby portions of the underlying heater layer 106 are either exposed or protected, the exposed or unprotected portions of the underlying heater layer 106 may be etched or removed. This patterning or removal of portions of the heater layer 106 may effectively form the one or more bottom contact trenches 108. Each of the one or more bottom contact trench(es) 108 may expose a respective underlying portion of an associated bottom wire 104.

Figure 4:
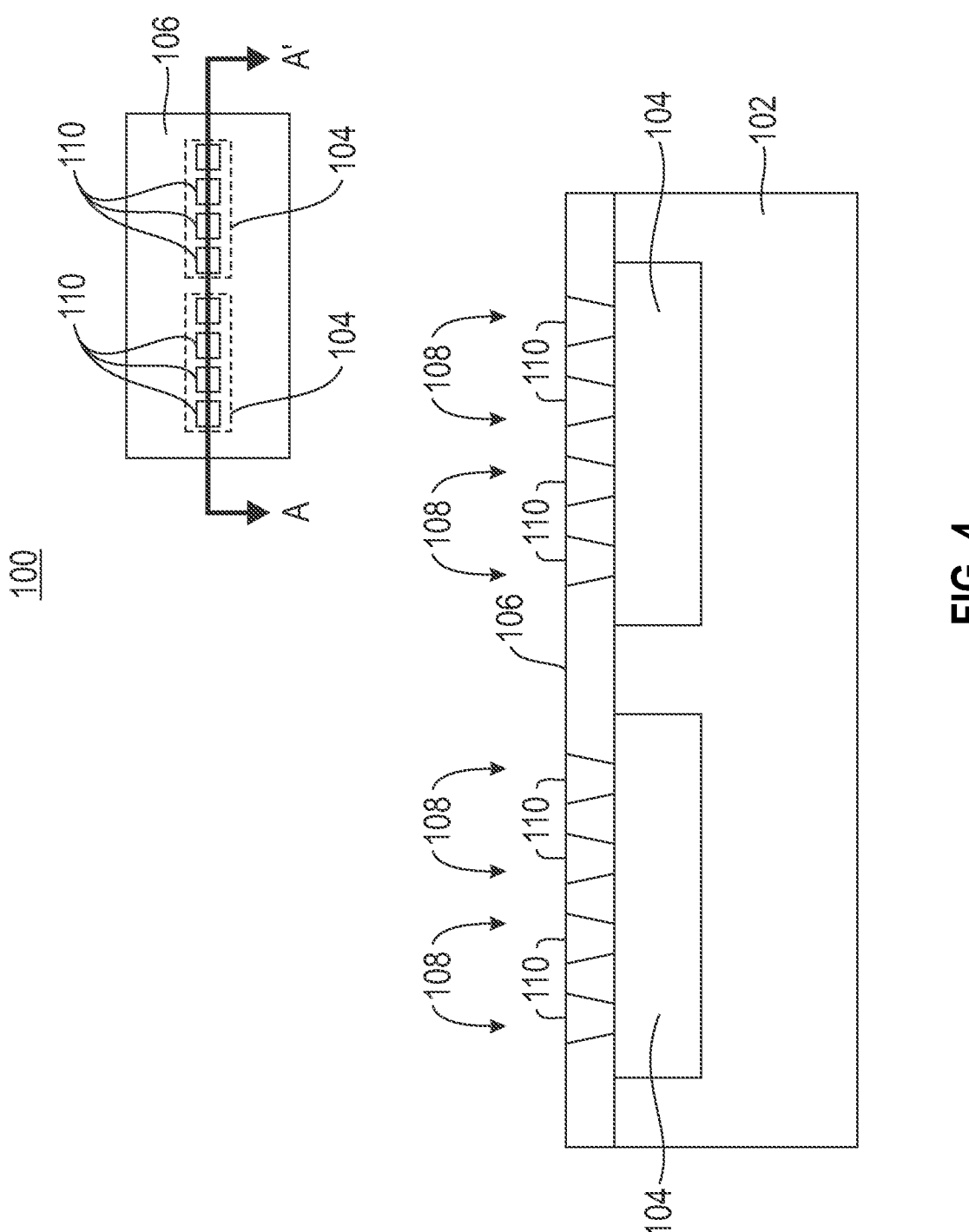

FIG. 4 depicts a cross-sectional view of a fabrication stage of forming semiconductor device 100, in accordance with various embodiments of the present disclosure. At the present fabrication stage, a bottom contact 110 is formed within bottom contact trench 108.

Bottom contact 110 may be formed by depositing electrically conductive material upon heater layer 106 and upon bottom wire 104 filling contact trench(es) 108. A CMP or other grinding technique may remove excess bottom contact 110 material. This planarization may result in the upper surface of heater layer 106 being coplanar with the upper surface of the one or more bottom contacts 110. The bottom contact 110 material may be any generally conductive material that is used as an electrode, such as, for example, Tungsten, Platinum, Titanium Nitride, Tantunum Nitride, Titanium Aluminum Nitride, alloys thereof, or the like.

In some implementations, bottom contact 110 includes an internal conductive region and a conductive barrier layer(s) (not shown) lining sidewalls and bottom surfaces of the internal conductive region. The conductive barrier layer(s) may be formed of titanium, titanium nitride, tantalum, tantalum nitride, cobalt, a combination thereof, or the like. The internal conductive region may be formed of metals such as Copper, Aluminum, Tungsten, Cobalt, Tungsten, Platinum, Titanium Nitride, Tantunum Nitride, Titanium Aluminum Nitride, alloys thereof, or the like.

The formation of bottom contact 110 may include forming a blanket conductive barrier layer extending into bottom contact trench 108, depositing metal over the blanket conductive barrier layer, and performing a planarization process, such as a CMP process grinding process, to remove excess portions of the blanket conductive barrier layer and excess portions internal conductive region so that the top surfaces of the heater layer 106 and the bottom contact 110 are coplanar.

Figure 5:
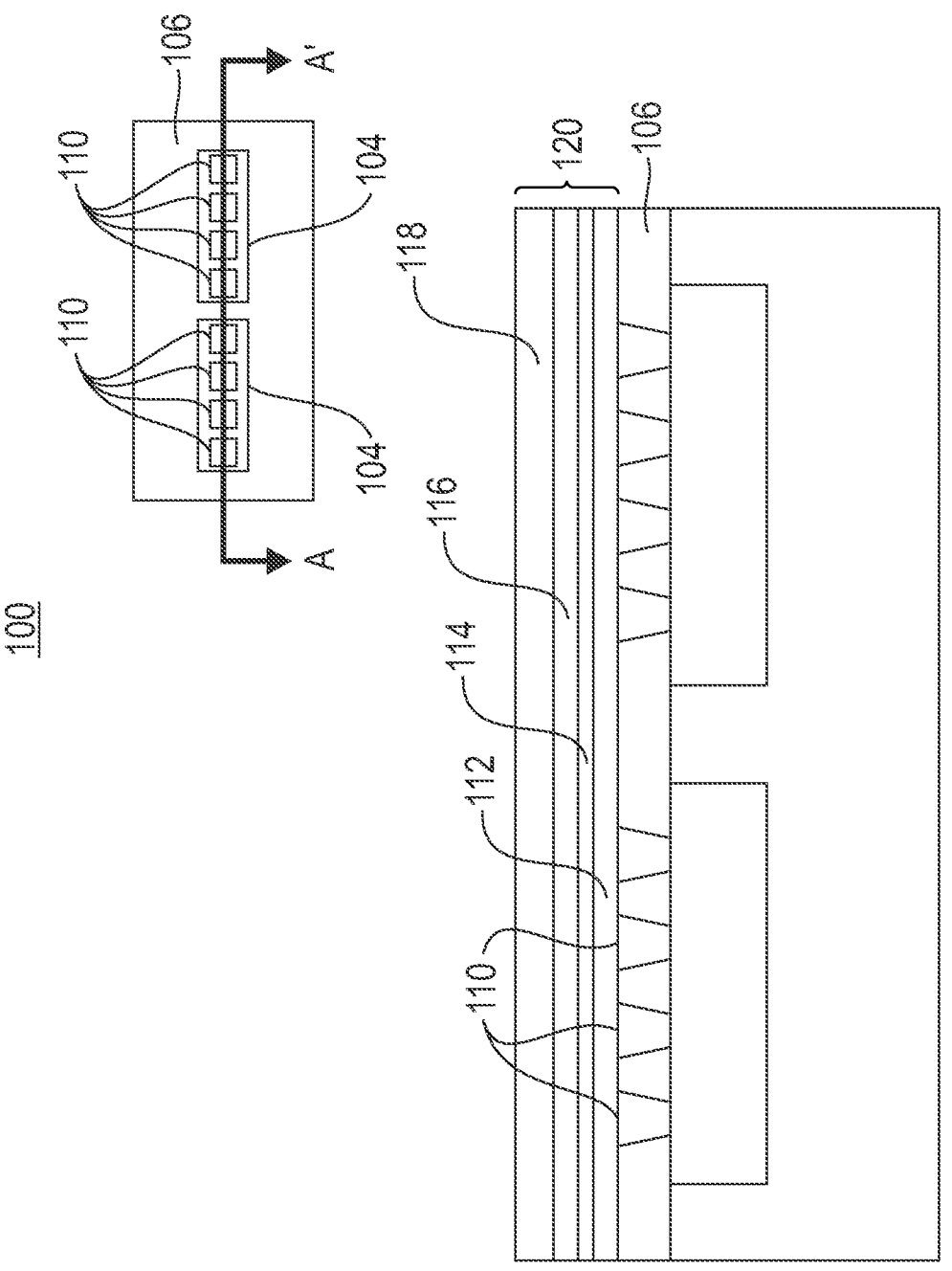

FIG. 5 depicts a cross-sectional view of a fabrication stage of forming semiconductor device 100, in accordance with various embodiments of the present disclosure. At the present fabrication stage, FeRAM cell build up layers 120 are formed upon the heater layer 106 and the bottom contact 110.

FeRAM cell build up layers 120 may be formed by initially depositing bottom electrode layer 112 upon the heater layer 106 and upon the bottom contact 110, by depositing ferroelectric dielectric layer 114 upon bottom electrode layer 112, by depositing top electrode layer 116 upon ferroelectric dielectric layer 114, and by depositing a resistor layer 118 upon top electrode layer 116.

Bottom electrode layer 112 may be formed upon the heating layer 106 by depositing electrically conductive electrode material, such as Titanium Nitride, Tantalum Nitride, Tungsten, or the like, onto the heater layer 106 and onto the bottom contact 110. Bottom electrode layer 112 may be formed to a thickness between 5 and 75 nm. In a particular implementation, bottom electrode layer 112 may be formed to a thickness between 20 and 30 nm. The bottom electrode layer 112 can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Bottom electrode layer 112 can comprise any suitable conducting material, including but not limited to, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, a suitable combination or alloys of these metals, or the like.

Ferroelectric dielectric layer 114 may be formed upon the bottom electrode layer 112 by depositing ferroelectric dielectric material, such as but not limited to $HfO_2$, TaO, TaNO, HfNO, TiO, TiNO, WO, WNO, ZrO, ZrNO, CeO, CeNO, and their mixture(s) such as HfZnO, onto the bottom electrode layer 112. Ferroelectric dielectric layer 114 may be formed to a thickness between 10 and 100 nm. In a particular implementation, ferroelectric dielectric layer 114 may be formed to a thickness between 40 and 50 nm. The ferroelectric dielectric layer 114 may be an undoped material layer or alternatively may be a dopped material layer. For example, ferroelectric dielectric layer 114 may be a ferroelectric dielectric layer doped with Silicon (Si), Aluminum (Al), Zirconium (Zr), Nitrogen (N), Yttrium (Y), Lanthanum (La), or the like.

Top electrode layer 116 may be formed upon ferroelectric dielectric layer 114 by depositing electrically conductive electrode material upon the ferroelectric dielectric layer 114. Top electrode layer 116 may be formed to a thickness between 5 and 75 nm. In an implementation, top electrode layer 116 may be formed to a thickness between 15 and 25 nm. The top electrode layer 116 can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc. Top electrode layer 116 is generally, but not required, formed of the same material as the material of the bottom electrode material layer 112.

Resistor layer 118 may be formed upon the top electrode layer 116 by depositing a dielectric material, such as Aluminum Gallium Nitride (AlGaN), Nitride rich Tantalum Nitride, or the like onto the top electrode layer 116. Resistor layer 118 may be formed to a thickness between 1 and 20 nm. In a particular implementation, resistor layer 118 may be formed to a thickness between 2 and 10 nm. In some implementations, resistor layer 118 may serve as a resistor to electrical current into and/or out of the FeRAM cell.

Figure 6:
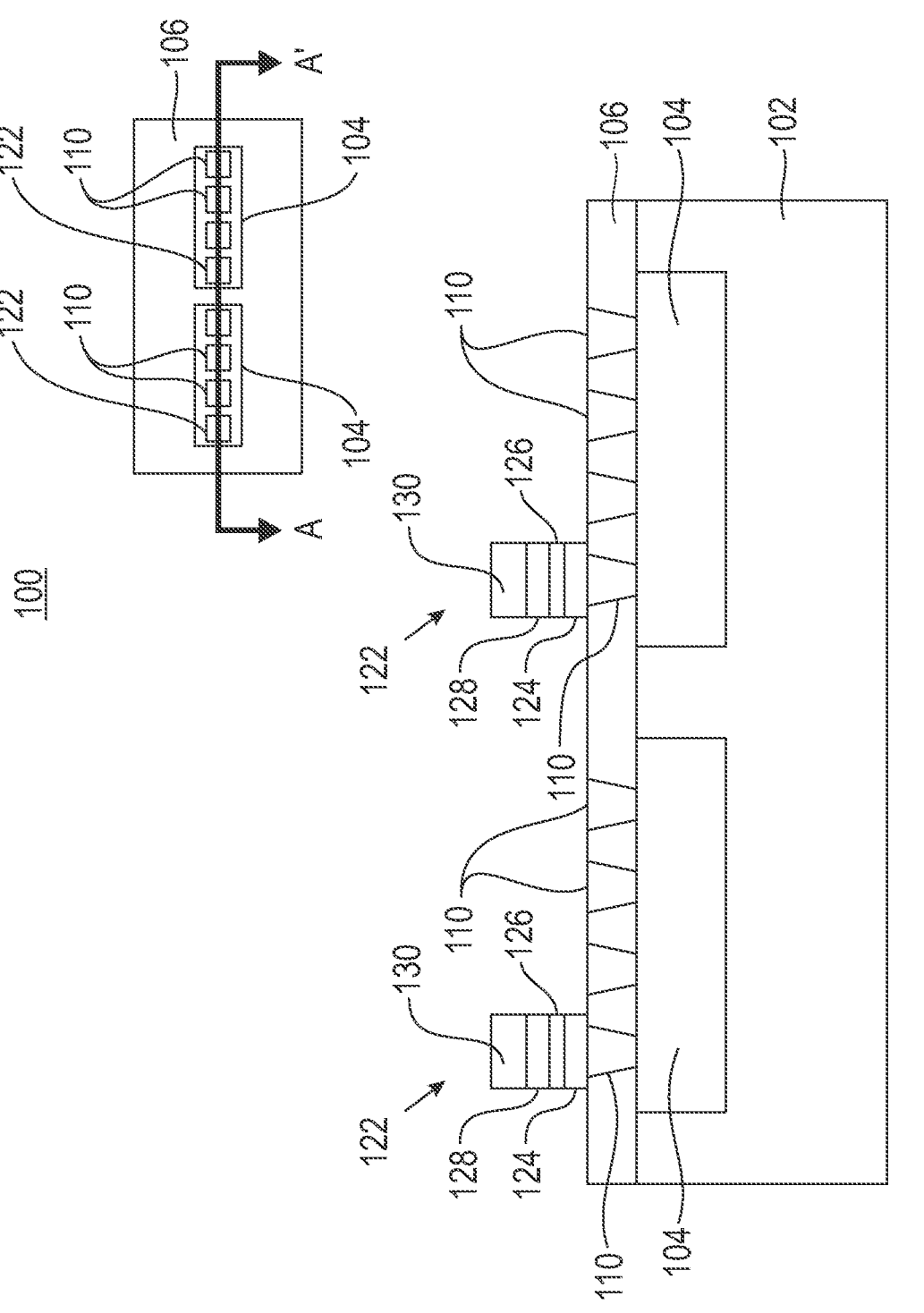

FIG. 6 depicts a cross-sectional view of a fabrication stage of forming semiconductor device 100, in accordance with various embodiments of the present disclosure. At the present fabrication stage, the FeRAM cell build up layers 120 are patterned to form one or more FeRAM cells 122.

Photolithography techniques may be utilized to develop or pattern the FeRAM cell build up layers 120. For example, a photolithography resist may be formed upon the resistor layer 118 and a pattern may be formed in the photolithography resist by removing portions of the photolithography resist. In a particular implementation, portions of the photolithography resist may be exposed to radiation, such as deep ultraviolet light, or electron beams. Once the patterning of the photolithography resist is completed, portions of the photolithography resist may be retained and portions of the photolithography resist may be etched away by an etchant that removes the photolithography resist. The portions of the photolithography resist that are retained may form patterned photolithography resist. The portions of photolithography resist that are etched away form resist trenches that may reveal the underlying FeRAM cell build up layers 120. Using the patterned photolithography resist as a mask whereby portions of the underlying FeRAM cell build up layers 120 are either exposed or protected, the exposed or unprotected portions of the underlying FeRAM cell build up layers 120 may be etched or removed. This patterning or removal of portions of the FeRAM cell build up layers 120 may effectively form the one or more FeRAM cells 122 and may expose the top surface of one or more portions of the heater layer 106 and may further expose the top surface of one or more bottom contacts 110.

The etch technique utilized in removal of the FeRAM cell build up layers 120 may be a physical or dry etch technique or a chemical wet etch. In a preferred implementation, the etch is a physical dry etch and, as such, there is less risk for damage (e.g., limited lateral etching of the FeRAM cell build up layers 120 may be experienced due to the lack of chemical etchants) to the one or more FeRAM cells 122.

After formation, FeRAM cell 122 may include bottom electrode 124 formed from a retained portion of the bottom electrode layer 112, may include ferroelectric dielectric 126 formed from a retained portion of the ferroelectric dielectric layer 114, may include top electrode 128 formed from a retained portion of the top electrode layer 116, and may include resistor 130 formed from a retained portion of the resistor layer 118.

Figure 7:
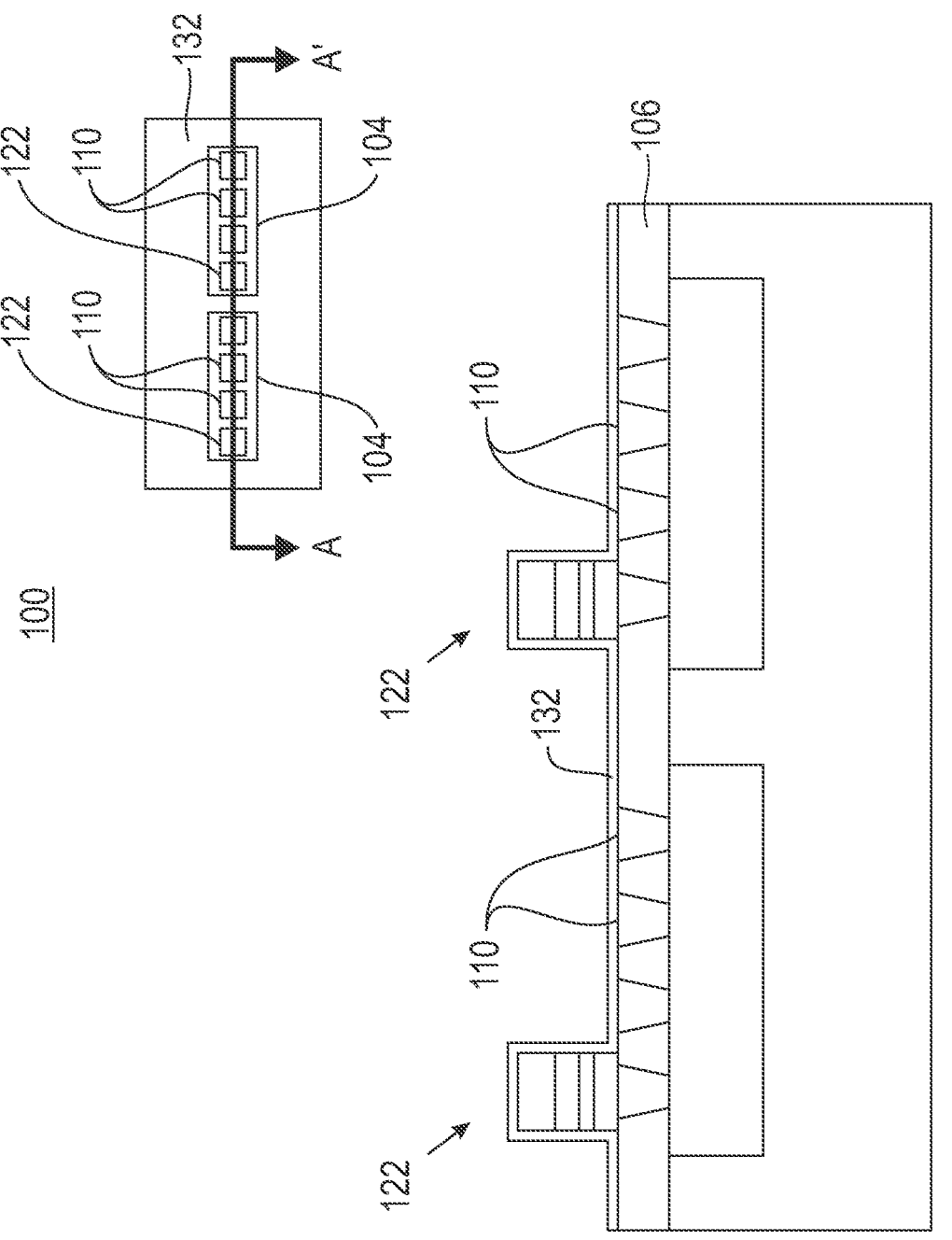

FIG. 7 depicts a cross-sectional view of a fabrication stage of forming semiconductor device 100, in accordance with various embodiments of the present disclosure. At the present fabrication stage, encapsulation layer 132 is formed upon and around FeRAM cell 122 and formed upon the heater layer 106 and the bottom contact 110.

Encapsulation layer 132 may be, for example, a Silicon layer or Silicon-based layer such as Silicon Nitride layer. Encapsulation layer 132 may be formed by depositing a blanket dielectric layer to a thickness between 5 and 200 nm. In a particular implementation, encapsulation layer 132 may be formed to a thickness between 3 and 50 nm. In some implementations, the portion of encapsulation layer 132 that is located upon the top surface of FeRAM cell 122 and/or upon the top surface of bottom heater(s) 110, and/or upon the top surface of heater layer 106 may be removed while portion(s) of the encapsulation layer 132 located on the sidewalls of the FeRAM cell 122 may be retained. In other words, encapsulation layer 132 may be formed as a spacer upon the sidewall(s) of FeRAM cell 122.

Figure 8:
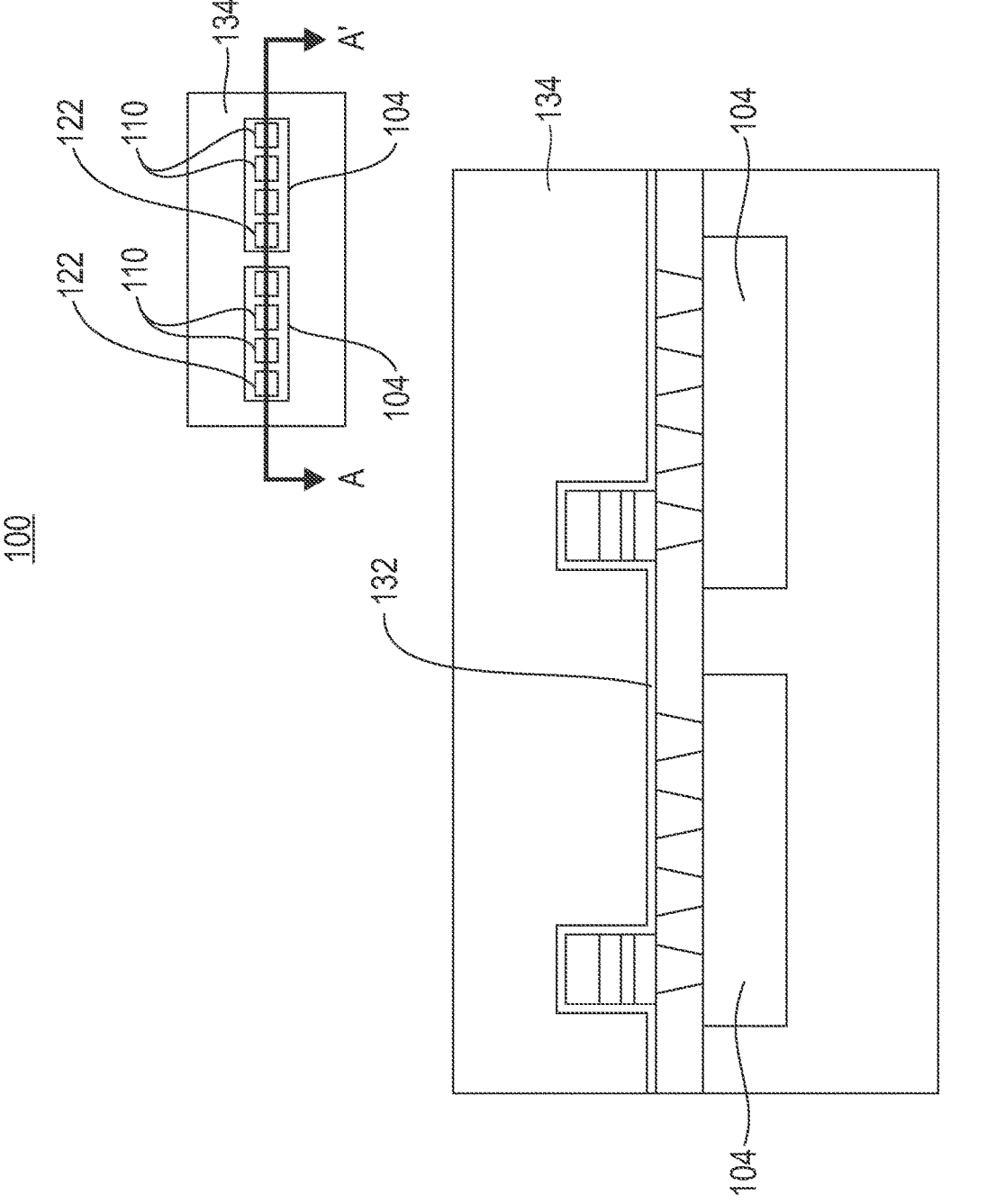

FIG. 8 depicts a cross-sectional view of a fabrication stage of forming semiconductor device 100, in accordance with various embodiments of the present disclosure. At the present fabrication stage, inter-layer dielectric (ILD) 134 is formed upon the encapsulation layer 132 over the FeRAM cell(s) 122.

If encapsulation layer 132 takes the form of the spacer upon the sidewall(s) of FeRAM cell 122, ILD 134 may be formed upon the FeRAM cell(s) 122 and around the encapsulation layer 132 spacer(s) and upon the top surface of bottom heater(s) 110, and/or upon the top.

ILD 134 may be formed by depositing a blanket layer of dielectric material, such as a low-k dielectric material, upon the encapsulation layer 132, over the heating layer 106, and over bottom contact(s) 110, as appropriate or desired. ILD 132 may be formed to a thickness generally greater than the height, or generally above, the top surface of the FeRAM cell 122 and/or the upper surface of the encapsulation layer 132 upon the top surface top surface of the FeRAM cell 122.

Figure 9:
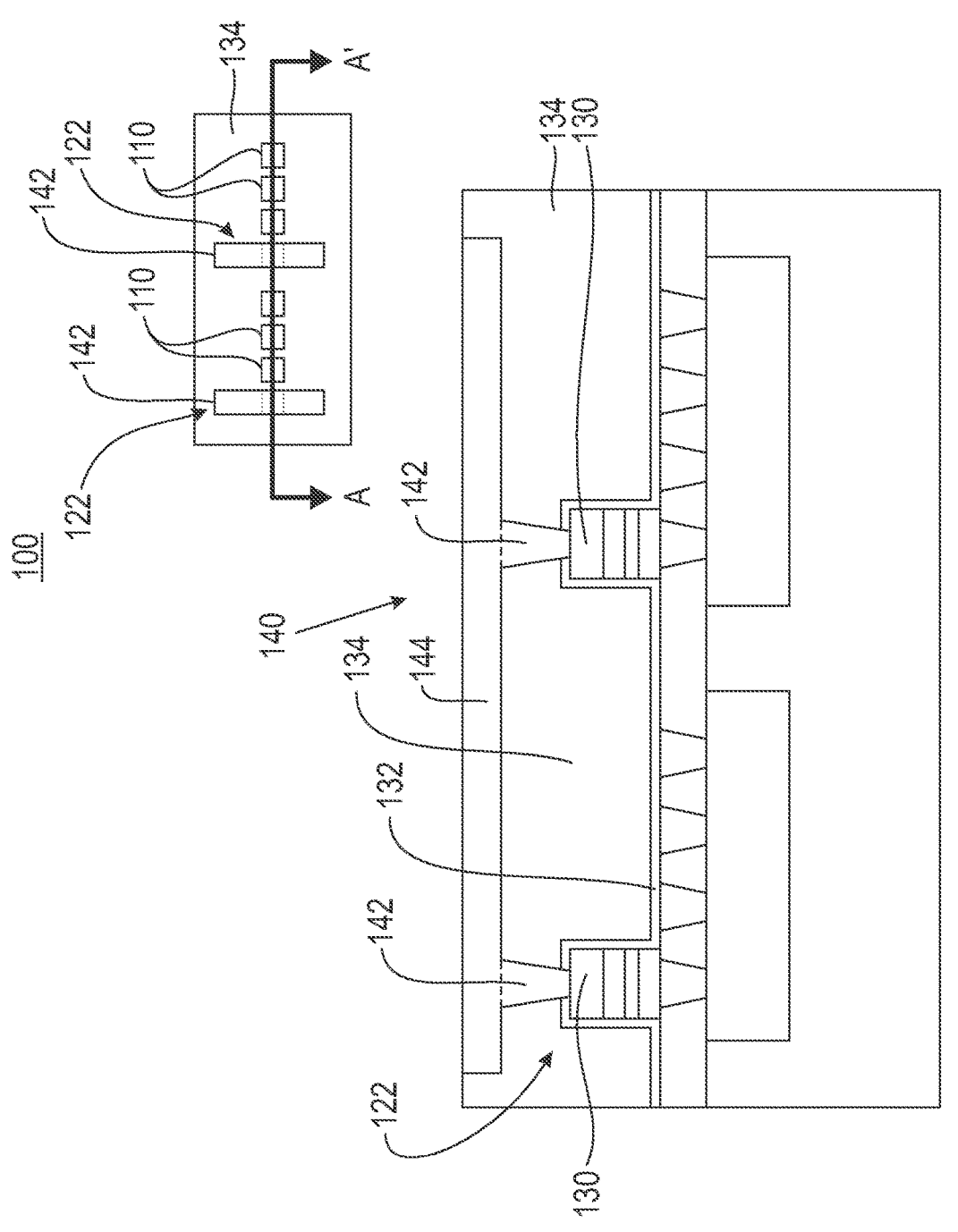

FIG. 9 depicts a cross-sectional view of a fabrication stage of forming semiconductor device 100, in accordance with various embodiments of the present disclosure. At the present fabrication stage, cell vertical interconnect access (VIA) 142 and temporary wire 144 are formed within ILD 134.

Cell VIA 142 and temporary wire 144 may be simultaneously formed by dual damascene techniques. For example, selective removal techniques may remove undesired portions of ILD 134 generally above a portion of FeRAM cell 122 to form a VIA trench and generally above the VIA trench to form temporary wire trench. The VIA trench may expose at least a portion of the resistor 130 of the FeRAM cell 122. The temporary wire trench may form a well or trench and may intersect with or otherwise be associated with one or more VIA trenches.

Etching techniques may be utilized to form wiring trenches with orthogonal type sidewall(s) (i.e., parallel to the sidewalls of the NVM cell) or to form wiring trenches with sloped type sidewalls(s), as depicted. In an implementation, the resistor 130 is utilized as the etch stop layer. The etch technique may be a physical or dry etch technique or a chemical wet etch. In a preferred implementation, the etch technique may be a chemical wet etch and resistor 130 is configured as a wet etchant stop.

Subsequently, cell VIA 142 is formed within the VIA trench and temporary wire 144 is formed within the temporary wire trench. In the present implementation, cell VIA 142 and temporary wire 144 may be simultaneously formed with the dual damascene techniques. For example, cell VIA 142 and temporary wire 144 may be simultaneously formed by depositing electrically conductive material, such as Copper, or the like, within VIA trench and within the temporary wire trench, respectively.

Cell VIA 142 may directly contact resistor 130 of the FeRAM cell 122. For example, cell VIA 142 contacts the entire upper surface or portion(s) of the upper surface of resistor 130. Because cell VIA 142 contacts or connects with resistor 130 of the FeRAM cell 122 instead of directly contacting with the top electrode 128 electric current flow into FeRAM cell 122 may be limited by the resistance of resistor 130 (which is tunable based upon the selection of the material and/or dimensions of resistor 130). By limiting the electrical current entering the FeRAM cell 122 with resistor 130, FeRAM cell 122 endurance may be improved and adverse impacts to component(s) that neighbor the FeRAM cell 122 may be limited. Temporary wire 144 may be electrically connected or otherwise associated with one or more underlying cell VIAs 142 such that current may flow through temporary wire 144 and into FeRAM cell 122 through an associated cell VIA 142.

For clarity, temporary wire 144 is deemed temporary or sacrificial due to temporary wire 144 being subsequently removed. Because temporary wire 144 is removed, the geometry of temporary wire 144 may be specifically chosen to achieve adequate current flow through FeRAM cell 122. For example, a larger (i.e., lower impedance) temporary wire 144 may be fabricated, relative to a replacement wire or other conductive feature that is subsequently formed over the FeRAM cell 122 and/or cell VIA 142 that may not achieve adequate current flow through FeRAM cell 122 to anneal ferroelectric dielectric 126. Further, space requirements may not allow such a large replacement wire or other conductive feature to achieve adequate current flow through FeRAM cell 122 to anneal ferroelectric dielectric 126. As such, the temporary wire 144 may be specifically fabricated to achieve such adequate current flow through FeRAM cell 122 and later removed to allow for a relatively smaller replacement wire or other conductive feature to comply with space requirements.

Figure 10:
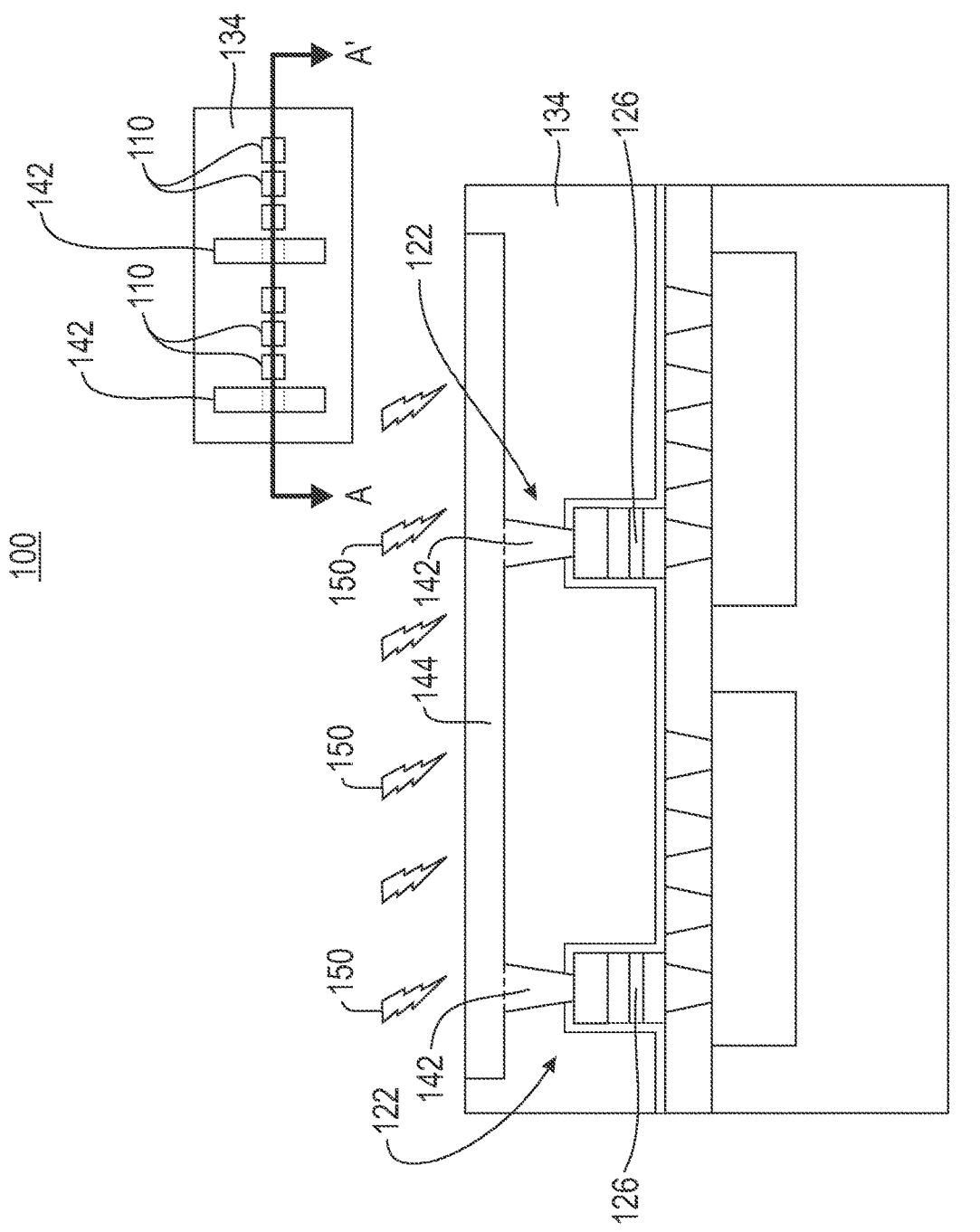

FIG. 10 depicts a cross-sectional view of a fabrication stage of forming semiconductor device 100, in accordance with various embodiments of the present disclosure. At the present fabrication stage, ferroelectric dielectric 126 is annealed to attain its ferroelectric phase by an induced current flow and heating process 150.

Induced current flow and heating process 150 occurs when current flow is induced though temporary wire 144 and associated cell VIA 142 which causes heating of the FeRAM cell 122. The resulting heating or anneal of ferroelectric dielectric 126 may crystalize the ferroelectric dielectric 126 such that the ferroelectric dielectric 126 embodies or has ferroelectric properties (e.g., spontaneous electric polarization of ferroelectric dielectric 126 can be reversed by the application of an external electric field, or the like).

The induced current flow and heating process 150 is a local annealing technique where heating is substantially confined to the FeRAM cell(s) 122, and to ferroelectric dielectric 126 therein, because of the induced electrical current flow through the temporary wire 144, as opposed to a global heating or annealing process where the entire semiconductor device 100 or a relatively larger region of semiconductor device 100 is heated to the requisite annealing temperature of ferroelectric dielectric 126. Induced current flow and heating process 150 may be referred to an electron charging process whereby temporary wire 144 is subjected to electron charging resulting in the induced electrical current flow through the temporary wire 144.

In a particular implementation, induced current flow and heating process 150 may be a technique or process where an external device or system induces current flow across temporary wire 144 and associated cell VIA 142 into FeRAM cell 122. For example, a plasma generating tool or an electron beam generating tool may be utilized to induce current flow across temporary wire 144 and associated cell VIA 142 into FeRAM cell 122, thereby heating ferroelectric dielectric 126. The plasma generating tool may be inductively coupled plasma (ICP) tool, a capacitively coupled plasma (CCP) tool, a microwave generated plasma tool, or the like. The electron beam generating tool may be a field emission-based electron beam generating tool, plasma-based electron beam tool, or the like.

In a particular implementation, where the FeRAM cell 122 has a square column geometry with width between 10-1000 nm and height of 1-500 nm, induced current flow and heating process 150 may generate 100-500 uA of electrical current across temporary wire 144 and associated cell VIA 142 into FeRAM cell 122, to achieve temperatures to adequately anneal a HfO$_2$ ferroelectric dielectric 126.

The geometry and material(s) of cell VIA 142 and temporary wire 144 may be chosen to achieve or allow a predetermined requisite induced current flow therethrough, to generate the requisite anneal temperature of ferroelectric dielectric 126 while staying below a predetermined maximum temperature of cell VIA 142 and temporary wire 144. By staying below the predetermined maximum temperature of cell VIA 142 and temporary wire 144, temperature based damage to semiconductor device 100 components or materials neighboring or substantially near cell VIA 142 and temporary wire 144 may be limited and induced current flow and heating process 150 may be adequately localized. In certain implementations, the predetermined maximum temperature of cell VIA 142 and temporary wire 144 may be 100°-1000° C. and the predetermined requisite induced current flow may be 100 uA-1 mA.

Figure 11:
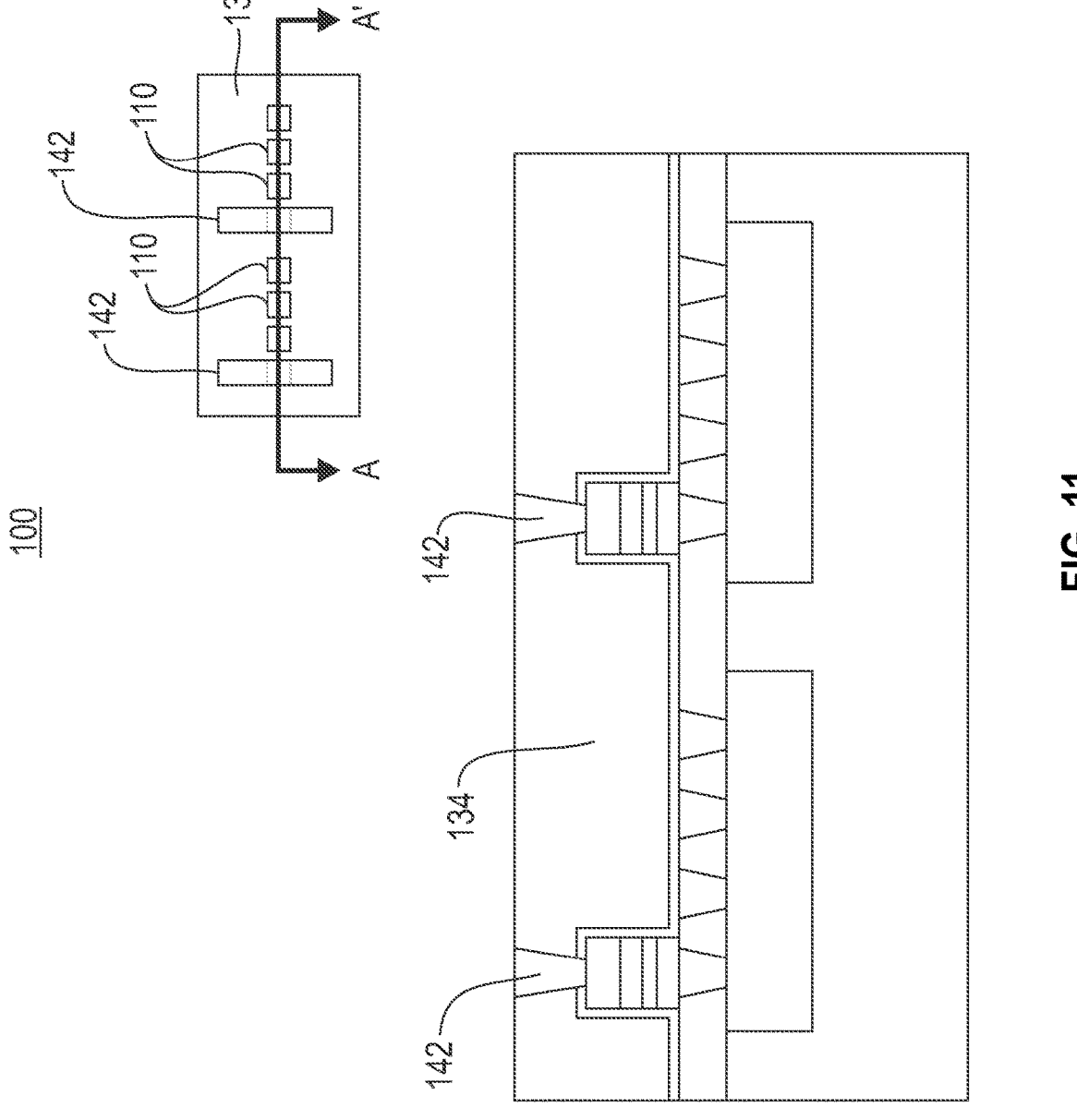

FIG. 11 depicts a cross-sectional view of a fabrication stage of forming semiconductor device 100, in accordance with various embodiments of the present disclosure. At the present fabrication stage, temporary wire 144 is removed and a top surface of ILD 134 and one or more cell VIAs 142 are planarized.

Temporary wire 144 may be removed by a planarization process, such as a CMP process or a mechanical grinding process, to remove temporary wire 144 and to achieve coplanarity of the top surface ILD 134 and the respective top surface(s) of one or more cell VIAs 142.

FIG. 12 through FIG. 15 depict cross-section views of alternative fabrication stages of semiconductor device 100 that include sequential fabrication of cell VIA 142 and temporary wire 144. The fabrication stages depicted in FIG. 12 through FIG. 15 may occur after the fabrication stage depicted in FIG. 8.

Figure 12:
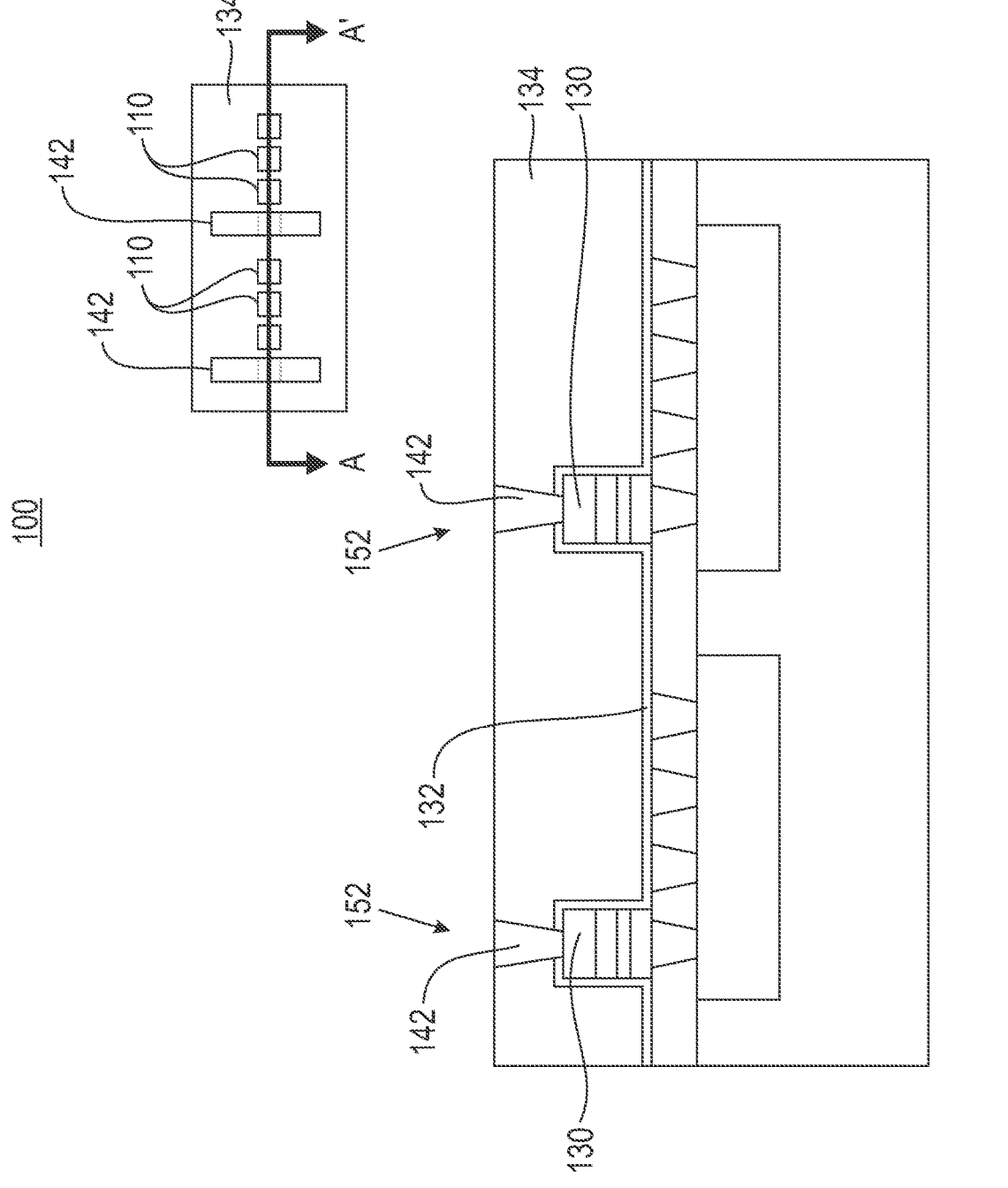

FIG. 12 depicts a cross-sectional view of a fabrication stage of forming semiconductor device 100, in accordance with various embodiments of the present disclosure. At the present fabrication stage, one or more cell VIAs 142 are formed within ILD 134.

Cell VIA 142 may be formed by damascene techniques. For example, selective removal or etching techniques may remove undesired portions of ILD 134 generally above a portion of FeRAM cell 122 to form a VIA trench 152. The VIA trench 152 may expose at least a portion of the resistor 130 of the FeRAM cell 122.

Etching techniques may be utilized to form VIA trenches 152 with orthogonal type sidewall(s) (i.e., parallel to the sidewalls of the FeRAM cell 122) or to form VIA trenches 152 with sloped type sidewalls(s), as depicted. In an implementation, the resistor 130 is utilized as the etch stop layer. The etch technique may be a physical or dry etch technique or a chemical wet etch. In a preferred implementation, the etch technique may be a chemical wet etch and resistor 130 is configured as a wet etchant stop.

Subsequently, cell VIA 142 is formed within the VIA trench 152. For example, cell VIA 142 may be formed by depositing electrically conductive material, such as Copper, or the like, within VIA trench 152.

Cell VIA 142 may directly contact resistor 130 of the FeRAM cell 122. For example, cell VIA 142 contacts the entire upper surface or portion(s) of the upper surface of resistor 130. Because cell VIA 142 contacts or connects with resistor 130 of the FeRAM cell 122 instead of directly contacting with the top electrode 128 electric current flow into FeRAM cell 122 may be limited by the resistance of resistor 130. By limiting the electrical current entering the FeRAM cell 122 with resistor 130, FeRAM cell 122 endurance may be improved and adverse impacts to component(s) that neighbor the FeRAM cell 122 may be limited.

Figure 13:
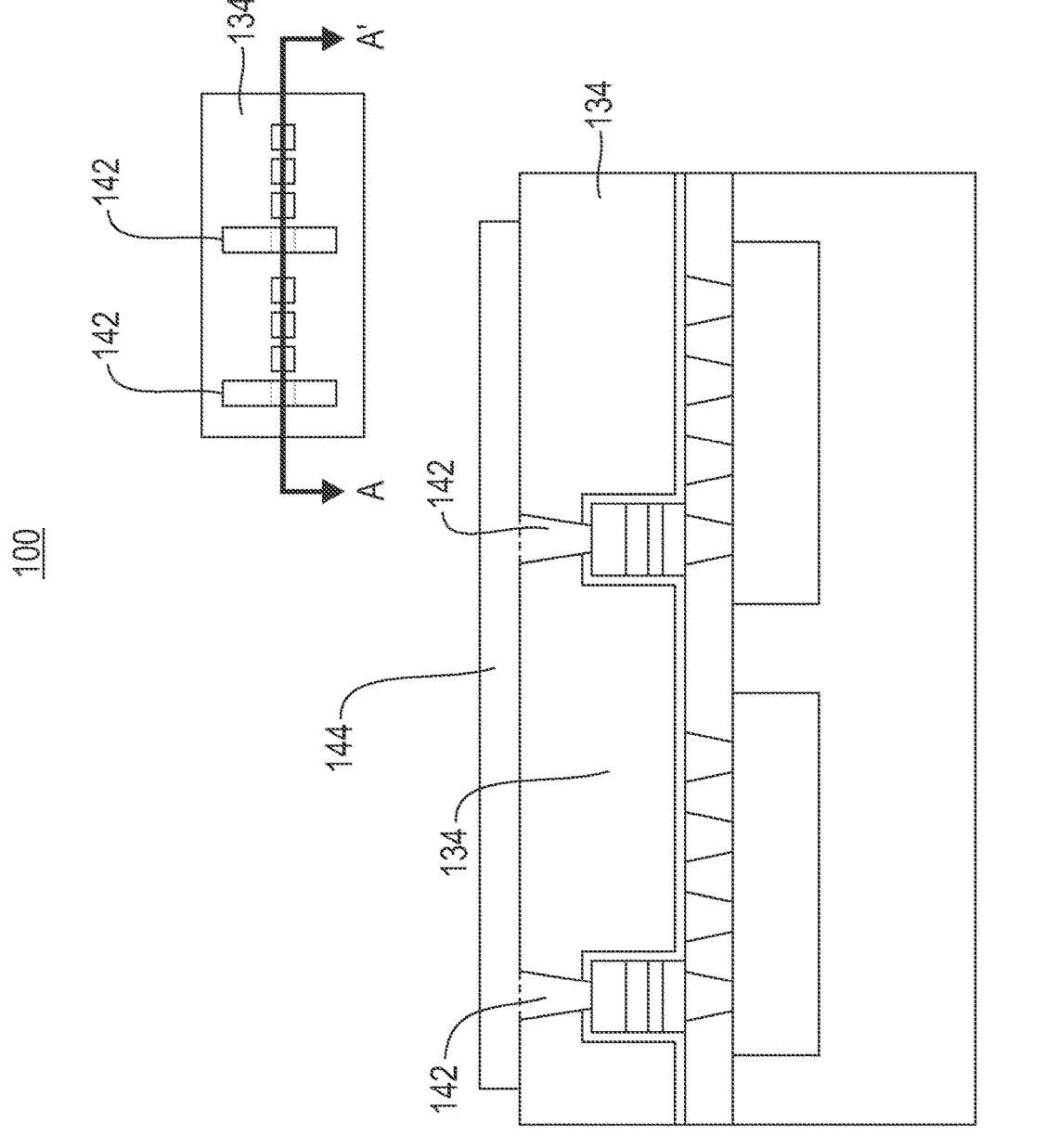

FIG. 13 depicts a cross-sectional view of a fabrication stage of forming semiconductor device 100, in accordance with various embodiments of the present disclosure. At the present fabrication stage, one or more cell temporary wires 144 are formed upon ILD 134 and upon cell VIAs 142.

The formation of one or more temporary wires 144 may be formed by photolithography techniques. For example, a photolithography resist (not shown) may be formed upon ILD 134 and upon cell VIAs 142. The photolithography resist may be applied as a liquid upon ILD 134 and upon cell VIAs 142 that may dry and be patterned generally forming trenches within the photolithography resist. The photolithography resist may also be a semi-solid film coated, laminated, or otherwise formed upon ILD 134 and upon cell VIAs 142.

A pattern may be formed in the photolithography resist by removing portions of the photolithography resist. For example, portions of the photolithography resist may be exposed to radiation, such as deep ultraviolet light, or electron beams. Once the patterning of the photolithography resist is completed, portions of the photolithography resist may be retained and portions of the photolithography resist may be etched away by an etchant that removes the photolithography resist. The portions of the photolithography resist that are retained may form patterned photolithography resist. The portions of photolithography resist that are etched away form temporary wire trench that may reveal or expose the underlying portions of ILD 134 and the underlying cell VIA 142.

The formation of one or more temporary wires 144 may be further formed by depositing metal within the temporary wire trench and upon the exposed the underlying portions of ILD 134 and the underlying cell VIA 142, performing a planarization process, such as a CMP process or a mechanical grinding process, to remove excess portions of the temporary wire(s) 144, and removing the photolithography resist.

Figure 14:
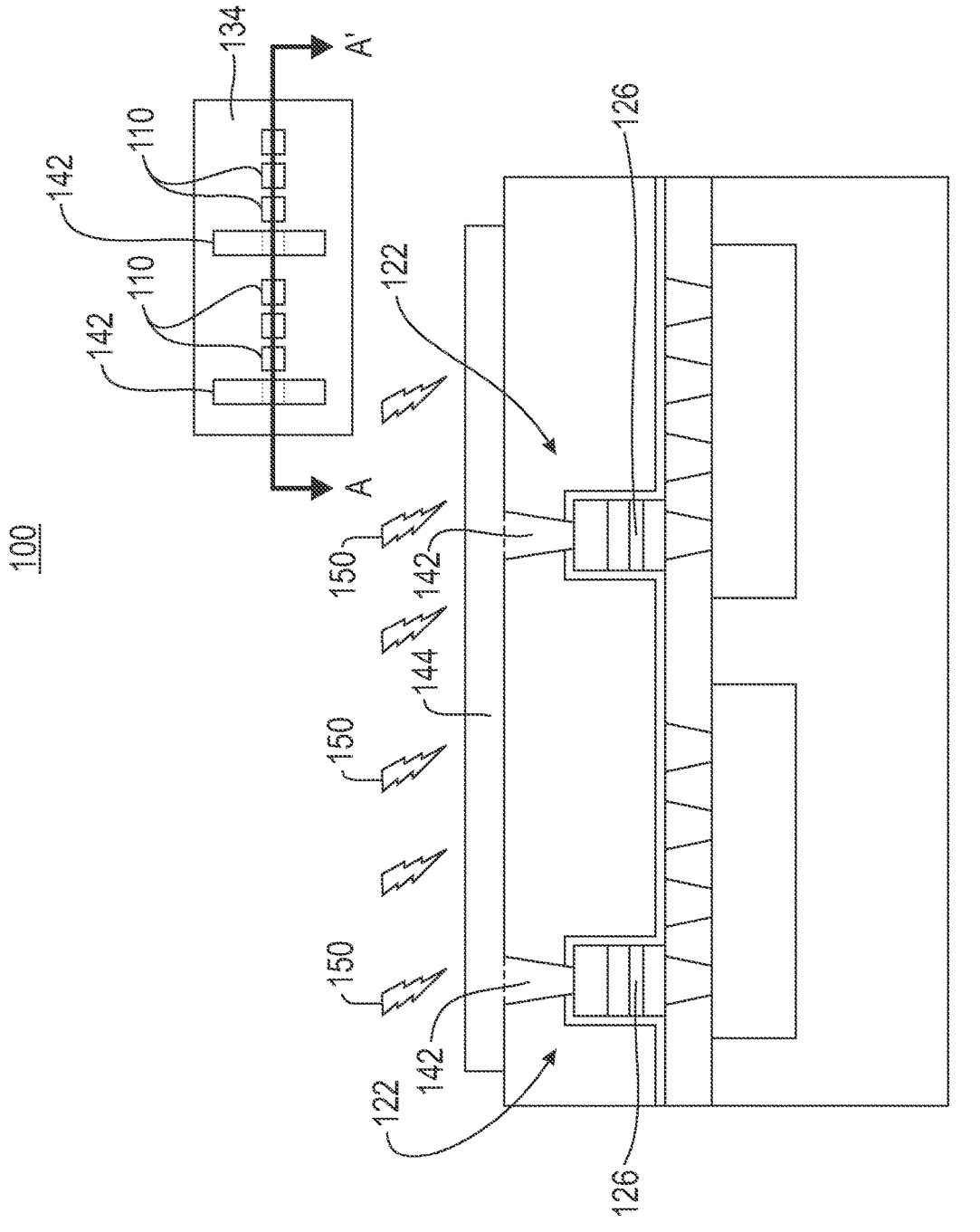

FIG. 14 depicts a cross-sectional view of a fabrication stage of forming semiconductor device 100, in accordance with various embodiments of the present disclosure. At the present fabrication stage, ferroelectric dielectric 126 is annealed to attain its ferroelectric phase by an induced current flow and heating process 150. The details of induced current flow and heating process 150 are disclosed above and are therefore not repeated.

Figure 15:
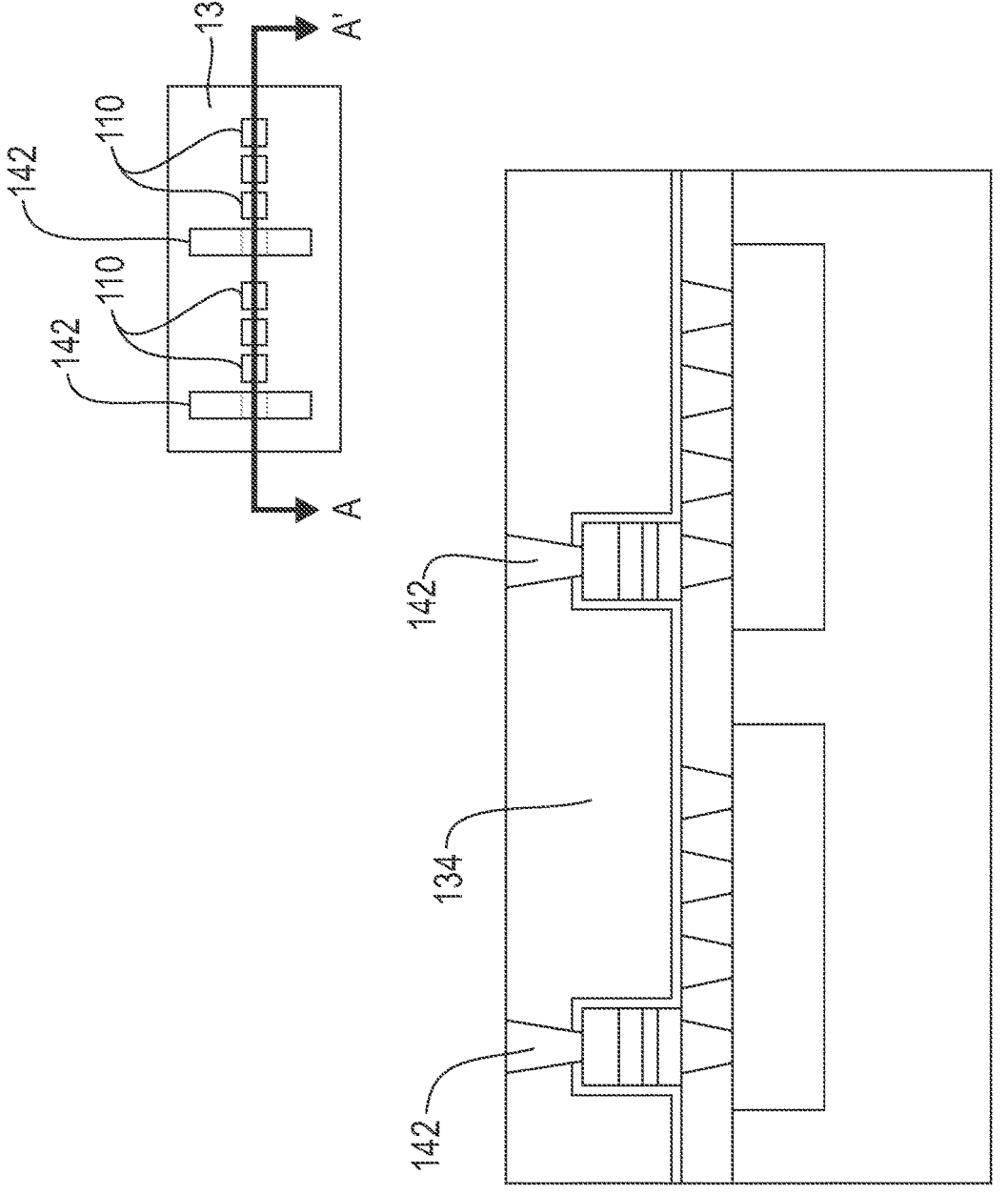

FIG. 15 depicts a cross-sectional view of a fabrication stage of forming semiconductor device 100, in accordance with various embodiments of the present disclosure. At the present fabrication stage, temporary wire 144 is removed and a top surface of ILD 134 and one or more cell VIAs 142 are planarized.

Temporary wire 144 may be removed by a planarization process, such as a CMP process or a mechanical grinding process, to remove temporary wire 144 and to achieve coplanarity of the top surface ILD 134 and the respective top surface(s) of one or more cell VIAs 142.

For clarity, semiconductor device 100 may undergo further fabrication stages to fabricate a final semiconductor device, IC device, IC chip, or the like. For example, semiconductor device 100 may undergo back end of the line (BEOL) fabrication stages to fabricate one or more M0-Mx wiring levels that include one or more wires, potential planes, or the like, that may be electrically connected to cell VIA 142 and/or bottom wire 104.

FIG. 16 depict method 200 of fabricating semiconductor device 100 that comprises FeRAM cell 122 with a locally annealed ferroelectric dielectric 126, in accordance with embodiments of the present disclosure.

Method 200 may include forming one or more bottom wires 104 upon or within substrate 102 (block 202) and may subsequently include forming heating layer 106 upon the one or more bottom wires 104 and upon the substrate 102 (block 204).

Method 200 may further include forming one or more bottom heaters 110 within the heating layer 106. For example, one or more bottom contact trenches 108 are formed within the heating layer 106. Each of the one or more bottom contact trenches 108 may expose a portion of the top surface of respective one or more bottom wires 104. Subsequently, a bottom heater 110 may be formed within each of the one or more bottom contact trenches 108 and a planarization process may result in respective top surface(s) of the bottom heater(s) 110 being coplanar with the top surface of the heating layer 106.

Method 200 may further include forming FeRAM build up layers 120 upon the heating layer 106 and upon the one or more bottom heaters 110 (block 208). FeRAM cell build up layers 120 may be formed by depositing bottom electrode layer 112 upon the heater layer 106 and upon the bottom contact(s) 110, by depositing ferroelectric dielectric layer 114 upon bottom electrode layer 112, by depositing top electrode layer 116 upon ferroelectric dielectric layer 114, and by depositing a resistor layer 118 upon top electrode layer 116.

Method 200 may further include forming FeRAM cell 122 from the FeRAM build up layers 120 (block 210). FeRAM cell 122 may be formed by retaining one or more portions of FeRAM build up layers 120 and by removing one or more portions of undesired FeRAM build up layers 120. The respective retained one or more portions of FeRAM build up layers 120 may be arranged in a stack of FeRAM build up layer 120 portions with coplanar sidewalls. Each FeRAM cell 122 may be located directly upon one bottom heater 110.

After formation, FeRAM cell 122 may include bottom electrode 124 formed from a retained portion of the bottom electrode layer 112, includes ferroelectric dielectric 126 formed from a retained portion of the ferroelectric dielectric layer 114, may include top electrode 128 formed from a retained portion of the top electrode layer 116, and may include resistor 130 formed from a retained portion of the resistor layer 118.

Method 200 may further include forming encapsulation layer 132 upon at least the sidewalls of the one or more FeRAM cells 122 (block 212). The encapsulation layer 132 may further be formed upon the top surface of the one or more FeRAM cells 122. The encapsulation may further be formed upon the respective top surfaces of one or more bottom heaters 110 and upon the top surface of at least a portion of heating layer 106.

Method 200 may be further include forming ILD 134 upon the encapsulation layer 132 (block 214). If encapsulation layer 132 is not fabricated upon the top surface of FeRAM cell 122 then ILD 134 may be further formed upon the top surface of FeRAM cell 122. If encapsulation layer 132 is not formed upon the respective top surfaces of one or more bottom heaters 110 and not formed upon the top surface of at least a portion of heating layer 106, ILD 134 may be further formed thereupon.

Method 200 may further include forming VIA 142 within the ILD 134 and upon of the FeRAM cell 122 (block 216) and may further include forming a temporary wire 144 within or upon the ILD 134 and upon the VIA 142 (block 218). Formation of the VIA 142 and temporary wire 144 may occur simultaneously (i.e., in the same dual damascene fabrication process) or sequentially (i.e., in sequential distinct single damascene fabrication processes), as described herein.

Method 200 may further include subjecting temporary wire 144 to induced current flow and heating process 150 to induce electrical current through temporary wire 144 across the associated FeRAM cell(s) 122 (block 220) to locally heat or anneal ferroelectric dielectric 126 (block 222). The resulting heating or anneal of ferroelectric dielectric 126 may crystalize the ferroelectric dielectric 126 such that the ferroelectric dielectric 126 embodies or has ferroelectric properties. The geometry and material(s) of cell VIA 142 and temporary wire 144 may be chosen to achieve or allow the predetermined requisite induced current flow therethrough to generate the requisite anneal temperature of ferroelectric dielectric 126 while staying below the predetermined maximum temperature of cell VIA 142 and temporary wire 144. By staying below the predetermined maximum temperature of cell VIA 142 and temporary wire 144, temperature based damage to semiconductor device 100 components or materials neighboring or substantially near cell VIA 142 and temporary wire 144 may be limited and induced current flow and heating process 150 may be adequately localized.

Method 200 may continue with removing temporary wire 144 (block 224). For example, a mechanical grinding or CMP process may remove the temporary wire 144 and may result in a top surface of the one or more VIAs 142 to be coplanar with the top surface of ILD 134.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device fabrication method comprising:
   forming a ferroelectric random-access memory (FeRAM) cell that includes a ferroelectric dielectric between a top electrode and a bottom electrode;
   forming a cell vertical interconnect access (VIA) upon the FeRAM cell;
   forming a temporary wire upon the cell VIA; and
   annealing the ferroelectric dielectric to attain a ferroelectric phase by inducing current flow though the temporary wire.

2. The semiconductor device fabrication method of claim 1, further comprising:
   after annealing the ferroelectric dielectric, removing the temporary wire.

3. The semiconductor device fabrication method of claim 2, wherein removing the temporary wire comprises mechanically grinding away the temporary wire and retaining at least a portion of the cell VIA.

4. The semiconductor device fabrication method of claim 1, wherein annealing the ferroelectric dielectric comprises crystalizing the ferroelectric dielectric to attain a ferroelectric phase.

5. The semiconductor device fabrication method of claim 4, wherein the ferroelectric dielectric attains the ferroelectric phase when electric polarization of the ferroelectric dielectric is reversable by application of an electric field to the ferroelectric dielectric.

6. The semiconductor device fabrication method of claim 1, wherein the ferroelectric dielectric is formed from Hafnium Oxide.

7. The semiconductor device fabrication method of claim 1, wherein the cell VIA and the temporary wire are simultaneously formed by dual damascene processes.

8. The semiconductor device fabrication method of claim 1, wherein inducing current flow though the temporary wire comprises:
   inducing current flow from the temporary wire though the cell VIA and into the FeRAM cell.

9. The semiconductor device fabrication method of claim 1, wherein inducing current flow though the temporary wire comprises electron charging the temporary wire.

10. A semiconductor device fabrication method comprising:
   forming a bottom wire over a substrate;
   forming a bottom heater contact upon the bottom wire;
   forming a ferroelectric random-access memory (FeRAM) cell upon the bottom heater contact, the FeRAM cell comprising a ferroelectric dielectric between a top electrode and a bottom electrode;
   forming a cell vertical interconnect access (VIA) upon the FeRAM cell;
   forming a temporary wire upon the cell VIA; and
   annealing the ferroelectric dielectric to attain a ferroelectric phase by inducing current flow though the temporary wire.

11. The semiconductor device fabrication method of claim 10, further comprising:
   after annealing the ferroelectric dielectric, removing the temporary wire.

12. The semiconductor device fabrication method of claim 11, wherein removing the temporary wire comprises mechanically grinding away the temporary wire and retaining at least a portion of the cell VIA.

13. The semiconductor device fabrication method of claim 10, wherein annealing the ferroelectric dielectric comprises crystalizing the ferroelectric dielectric to attain a ferroelectric phase.

14. The semiconductor device fabrication method of claim 13, wherein the ferroelectric dielectric attains the ferroelectric phase when electric polarization of the ferroelectric dielectric is reversable by application of an electric field to the ferroelectric dielectric.

15. The semiconductor device fabrication method of claim 10, wherein the ferroelectric dielectric is formed from Hafnium Oxide.

16. The semiconductor device fabrication method of claim 10, wherein the cell VIA and the temporary wire are simultaneously formed by dual damascene processes.

17. The semiconductor device fabrication method of claim 10, wherein inducing current flow though the temporary wire comprises:

inducing current flow from the temporary wire though the cell VIA and into the FeRAM cell.

18. The semiconductor device fabrication method of claim 10, wherein inducing current flow though the temporary wire comprises electron charging the temporary wire.

19. The semiconductor device fabrication method of claim 10, wherein the FeRAM cell further comprises a resistor upon the top electrode.

20. A method comprising:

forming a ferroelectric random-access memory (FeRAM) cell comprising a ferroelectric layer;

forming a temporary conductive structure in electrical contact with the FeRAM cell; and annealing the ferroelectric layer by inducing current flow through the temporary conductive structure to attain a ferroelectric phase transition within the ferroelectric layer.

21. The method of claim 20, further comprising:

removing the temporary conductive structure after annealing the ferroelectric layer.

22. The method of claim 20, wherein annealing the ferroelectric layer comprises crystallizing the ferroelectric layer.

* * * * *